US008872249B2

(12) United States Patent
Jung

(10) Patent No.: US 8,872,249 B2
(45) Date of Patent: Oct. 28, 2014

(54) NONVOLATILE MEMORY DEVICE AND METHOD FOR FABRICATING THE SAME

(75) Inventor: Sung-Wook Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/604,316

(22) Filed: Sep. 5, 2012

(65) Prior Publication Data
US 2013/0168753 A1 Jul. 4, 2013

(30) Foreign Application Priority Data
Dec. 29, 2011 (KR) .......................... 10-2011-0146186

(51) Int. Cl.
H01L 23/532 (2006.01)
(52) U.S. Cl.
USPC ........... 257/314; 257/315; 257/316; 257/317; 257/318; 257/319; 257/320; 257/321; 257/322; 257/324; 257/325; 257/326; 257/74
(58) Field of Classification Search
USPC .......................................... 257/74, 313–326
See application file for complete search history.

(56) References Cited

U.S. PATENT DOCUMENTS

| 2010/0314678 A1 | 12/2010 | Lim et al. |
| 2011/0233645 A1* | 9/2011 | Iinuma .......................... 257/324 |
| 2012/0051143 A1* | 3/2012 | Yoon et al. .............. 365/185.22 |
| 2013/0161818 A1* | 6/2013 | Han .............................. 257/751 |

FOREIGN PATENT DOCUMENTS

| KR | 1020100086435 | 7/2010 |
| KR | 1020100087743 | 8/2010 |

* cited by examiner

Primary Examiner — Matthew W Such
Assistant Examiner — Stephen C Smith
(74) Attorney, Agent, or Firm — IP & T Group LLP

(57) ABSTRACT

The technology of the present invention relates to a non-volatile memory device and a fabrication method thereof. The non-volatile memory device includes channel layers protruding vertically from a substrate, a plurality of hole-supply layers and a plurality of gate electrodes, which are alternately stacked along the channel layers, and a memory film interposed between the channel layers and the gate electrodes and between the hole-supply layers and the gate electrodes. According to this technology, the hole-supply layers are formed between the memory cells such that sufficient holes are supplied to the memory cells during the erase operation of the memory cells, whereby the erase operation of the memory cells is smoothly performed without using the GIDL current, and the properties of the device are protected from being deteriorated due to program/erase cycling.

12 Claims, 16 Drawing Sheets

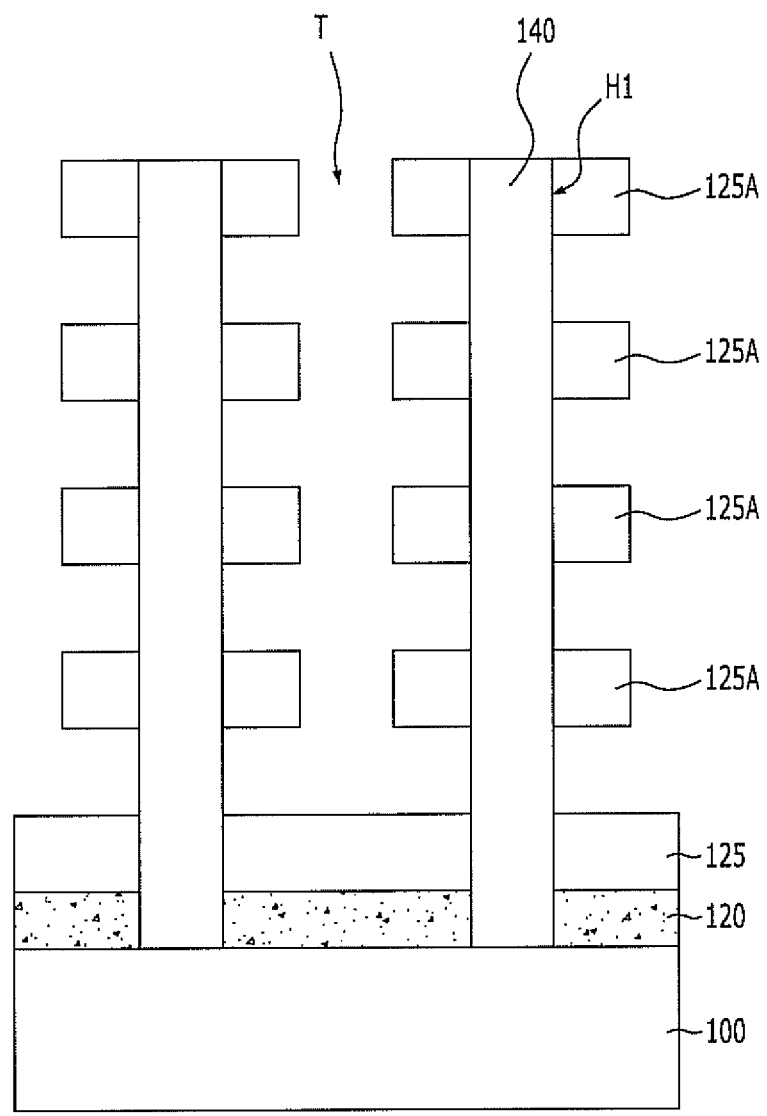

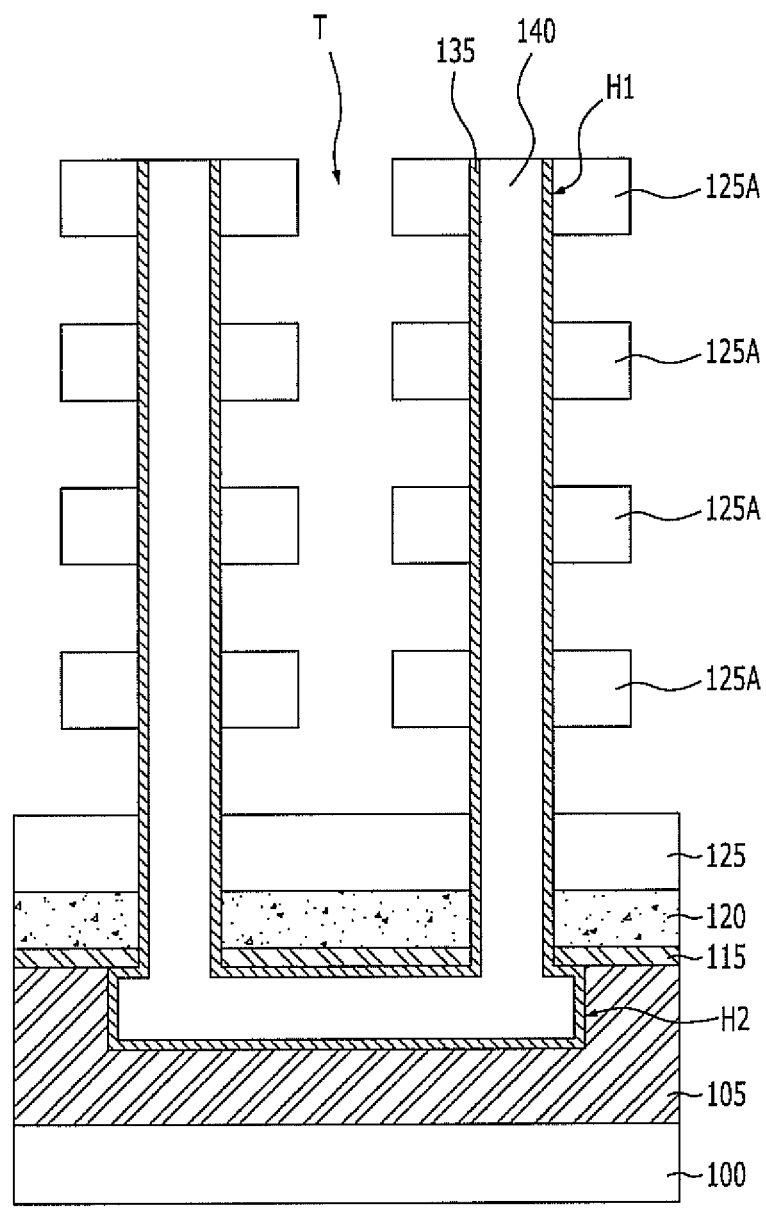

NONVOLATILE MEMORY DEVICE AND METHOD FOR FABRICATING THE SAME

CROSS-REFERENCE TO RELATED APPLICATIONS

The present application claims priority of Korean Patent Application No. 10-2011-0146186, filed on Dec. 29, 2011, which is incorporated herein by reference in its entirety.

BACKGROUND

1. Field

Exemplary embodiments of the present invention relate to a non-volatile memory device and a fabrication method thereof. More particularly, the exemplary embodiments relate to a three-dimensional non-volatile memory device comprising a plurality of memory cells stacked vertically from a substrate and a fabrication method thereof.

2. Description of the Related Art

Non-volatile memory devices are memory devices that maintain data stored therein even when the power supply is cut off. Currently, various non-volatile memory devices, for example, flash memories, are being widely used.

As an increase in the integration density of two-dimensional memory devices having single-layer memory cells formed on a semiconductor substrate has recently become infeasible, three-dimensional non-volatile memory devices having a plurality of memory cells formed along channel layers protruding vertically from a semiconductor substrate have been proposed.

In conventional three-dimensional non-volatile memory devices, the channel layer is generally formed using non-doped polysilicon, and the source and drain regions are formed by n-type doping. Because these memory devices are not provided with a hole-supply source capable of supplying sufficient holes to the memory cells, the erase operation of the memory cells may not be smooth.

In an attempt to resolve this concern, a method for erasing memory cells using a GIDL (Gate-Induced Drain Leakage) current was proposed. However, even this method may not supply sufficient holes to the memory cells during the erase operation of the memory cells. In addition, the use of the GIDL current has a concern regarding the deterioration of properties of the device due to program/erase cycling.

SUMMARY

Exemplary embodiments of the present invention are directed to a non-volatile memory device and a fabrication method thereof, in which hole-supply layers are formed between memory cells such that sufficient number of holes can be supplied to the memory cells during the erase operation of the memory cells. As a result, the erase operation of the memory cells may be easily performed without using the GIDL current, and the properties of the device may be prevented from being deteriorated due to program/erase cycling.

In accordance with an exemplary embodiment of the present invention, a non-volatile memory device may include channel layers protruding vertically from a substrate, a plurality of hole-supply layers and a plurality of gate electrodes, which are alternately stacked along the channel layers, and a memory film interposed between the channel layers and the gate electrodes and between the hole-supply layers and the gate electrodes.

In accordance with another exemplary embodiment of the present invention, a method for fabricating a non-volatile memory device may include forming an interlayer insulating film on a substrate, alternately stacking a plurality of hole-supply layers and a plurality of sacrificial layers on the interlayer insulating film, selectively etching the hole-supply layers and the sacrificial layers to form channel holes which expose the substrate, forming a channel layer in each of the channel holes, forming a slit hole through a portion of the hole-supply layers, and the sacrificial layers between the channel holes, removing the sacrificial layers exposed through the slit hole; and sequentially forming a memory film and gate electrodes in a space formed by removing the sacrificial layers.

BRIEF DESCRIPTION OF THE DRAWINGS

FIGS. 1A to 1E are cross-sectional views illustrating a non-volatile memory device in accordance with a first embodiment of the present invention and a fabrication method thereof.

FIGS. 3A to 3G are cross-sectional views illustrating a non-volatile memory device in accordance with a third embodiment of the present invention and a fabrication method thereof.

DETAILED DESCRIPTION

Figure 1A:
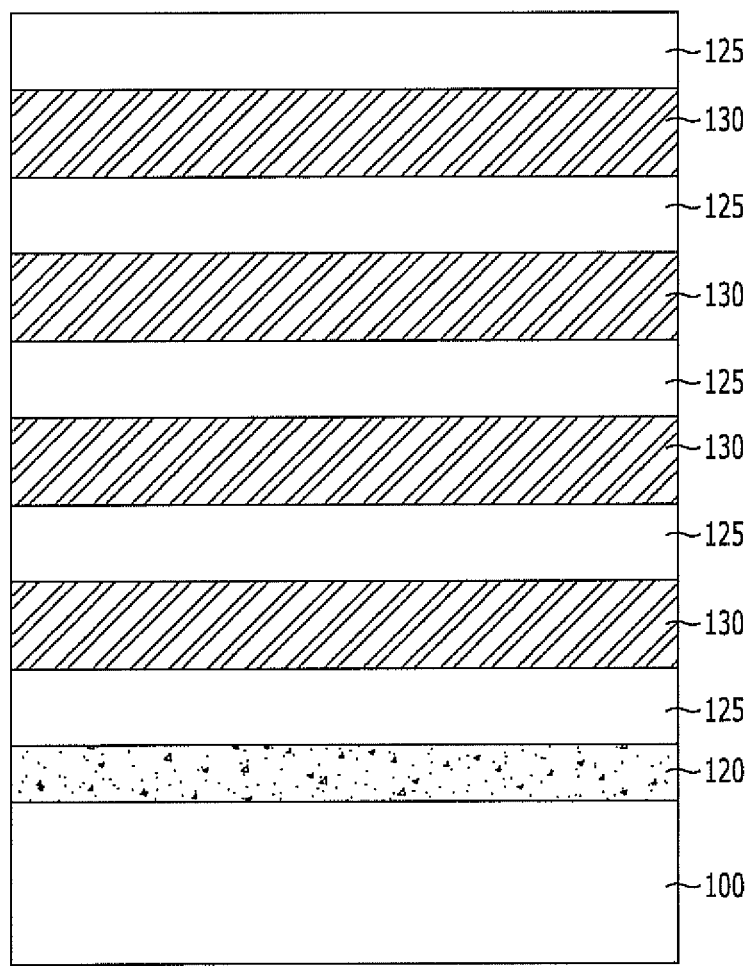

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
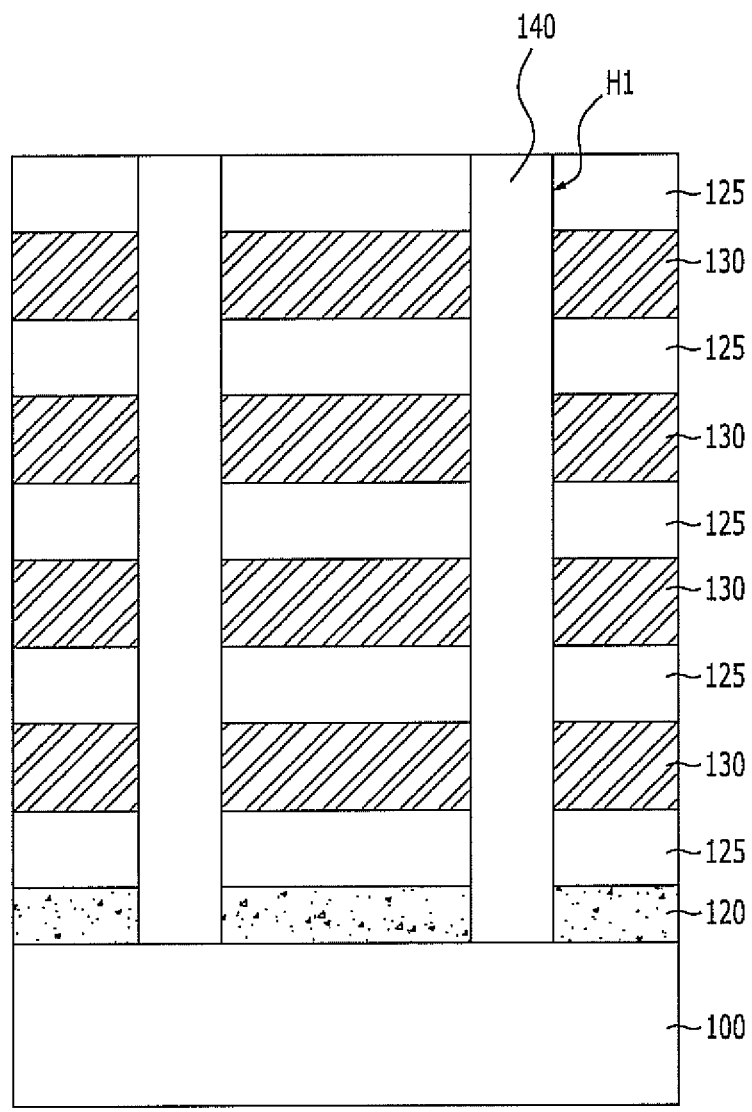
Figure 1D:
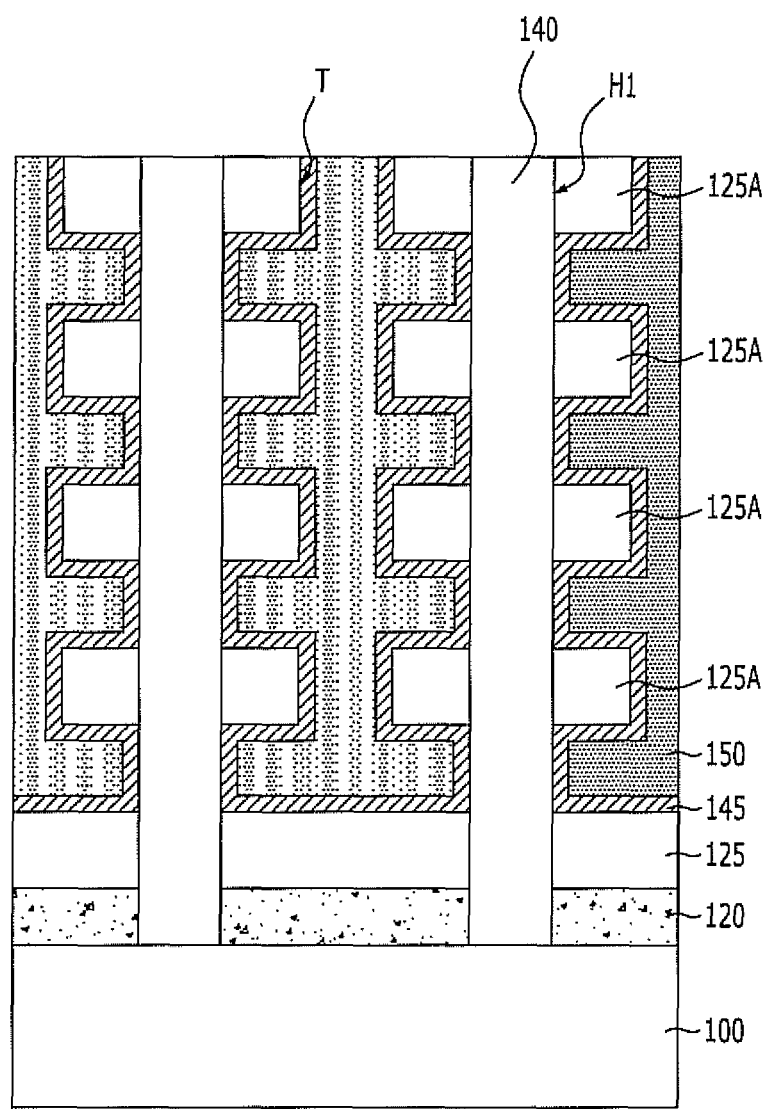
Figure 1E:
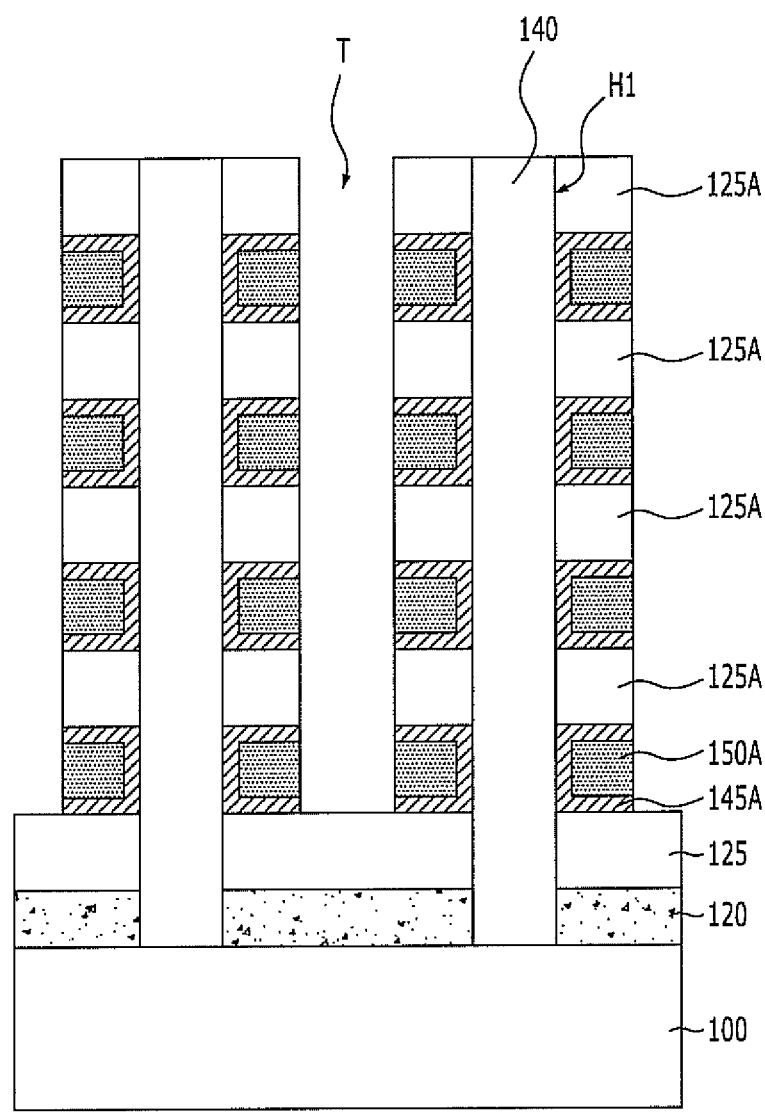

FIGS. 1A to 1E are cross-sectional views illustrating a non-volatile memory device in accordance with the first embodiment of the present invention and a fabrication method thereof. Specifically, FIG. 1E is a cross-sectional view showing the non-volatile memory device in accordance with the first embodiment of the present invention, and FIGS. 1A to 1D are cross-sectional views showing an example of intermediate processes for fabricating the memory device shown in FIG. 1E.

Referring to FIG. 1A, an interlayer insulating film 120 is formed on a substrate 100. The substrate 100 may be a semiconductor substrate such as a single-crystal semiconductor substrate and may include any underlying structure (not shown). Also, the interlayer insulating film 120 may be formed of an oxide- or nitride-based material.

Then, a plurality of hole-supply layers 125 and a plurality of sacrificial layers 130 are alternately stacked on the interlayer insulating film 120. The structure including the alternating stacks of the plurality of hole-supply layers 125 and the plurality of sacrificial layers 130 will hereinafter be referred to as the "stack structure". Herein, the highest and lowest layers of the stack structure may be the hole-supply layers 125.

The hole-supply layers 125 supply sufficient holes to memory cells during the erase operation of the memory cells and may be formed of a p-type semiconductor, for example, p+ polysilicon. Also, the sacrificial layers 130 are removed in a subsequent process such that they serve as molds that provide spaces where gate electrodes are to be formed. The sacrificial layers 125 may be formed using a material having an etch selectivity with respect to the hole-supply layers 125, for example, an oxide-based material such as silicon oxide ($SiO_2$). Meanwhile, although FIG. 1A illustrates four sacrificial layers 130, more than or less than four sacrificial layers 130 may also be formed.

Referring to FIG. 1B, the stack structure and the interlayer insulating film 120 are selectively etched to form channel holes H1 which expose the substrate 100. The channel holes H1 may have an oval shape when viewed from the top, and a plurality of the channel holes may be arranged in the form of a matrix.

Then, channel layers 140 are formed in the channel holes H1. The channel layers 140 may be formed using, for example, a semiconductor material such as polysilicon. In this first exemplary embodiment, the channel layers 140 may be formed to completely fill the channel holes H1, but the scope of the present invention is not limited thereto. In other embodiments, the channel layers 140 may also be formed to a thickness that does not completely fill the channel holes H1.

Referring to FIG. 1C, the hole-supply layers 125 (excluding the hole supply layer 125 located at the lowest portion of the stack structure) and the sacrificial layers 130 from FIG. 1B are selectively etched to form a slit hole T through the hole-supply layers 125 and sacrificial layers 130 at both sides of the channel holes H1. A plurality of the slit holes may be arranged in parallel to each other in the form of slits that extend in a direction crossing the cross-section shown in FIG. 1C. The remaining hole-supply layers 125 are referred to as the hole-supply layer patterns 125A.

Meanwhile, if the interlayer insulating film 120 is formed using a material having an etch selectivity with respect to the sacrificial layers 130, for example, a nitride-based material, even the hole-supply layer 125 located at the lowest portion of the stack structure may be etched such that the slit hole T is formed through all the hole-supply layers 125.

Then, the sacrificial layers 130 exposed through the slit hole T are removed. To remove the sacrificial layers 130, a wet etching process may be performed using an etch selectivity with respect to the hole-supply layer patterns 125A. In addition, the hole-supply layer 125 located at the lowest portion of the stack structure may prevent the interlayer insulating layer from being etched.

Referring to FIG. 1D, a memory film 145 is formed along the inner wall of the space formed by removing the sacrificial layers 130 through the slit hole T.

Herein, the memory film 145 may be formed by sequentially depositing a tunnel insulating film, a charge trapping film and a charge blocking film. The tunnel insulating film is a film for charge tunneling and may be formed using, for example, oxide. The charge trapping film may serve to trap a charge to store data and may be formed using, for example, nitride. In addition, the charge blocking film serves to block the charge in the charge trapping film from moving out from the charge trapping film and may be formed using, for example, oxide. In other words, the memory film 145 may have a three-layer structure of ONO (Oxide-Nitride-Oxide).

Then, a conductive film 150 for gate electrodes is formed on the memory film 145 to fill the space formed by removing the sacrificial layers 130. The conductive film 150 for gate electrodes may include a conductive material, for example, a metal or a metal nitride, which may be conformally deposited by chemical vapor deposition (CVD) or atomic layer deposition (ALD).

Referring to FIG. 1E, the memory film 145 and the conductive film 150 for gate electrodes in FIG. 1D, which are present in the slit hole T, are etched such that the memory film 145 and the conductive film 150 are separated with respect to the slit hole T. As a result, gate electrodes 150A are formed between the hole-supply layer patterns 125A. The remaining memory film 145 is referred to the memory film patterns 145A.

In this first exemplary embodiment, the memory film patterns 145A may be interposed between the channel layers 140 and the gate electrodes 150A and between the hole-supply layer patterns 125A or the hole-supply layers 125 and the gate electrodes 150A, but the scope of the present invention is not limited thereto. In other embodiments, an insulating film different from the memory film patterns 145A, for example, a single-material film such as an oxide or nitride film, may be interposed between the hole-supply layer patterns 125A and the gate electrodes.

According to the above fabrication method, the first exemplary embodiment of the present invention as shown in FIG. 1E may be fabricated.

Referring to FIG. 1E, the first exemplary embodiment of the present invention may include a channel layer 140 protruding vertically from a substrate 100, a plurality of hole-supply layer patterns 125A and a plurality of gate electrodes 150A, which are alternately stacked along the channel layer 140, memory film patterns 145A, and memory film patterns 145A or insulating films interposed between the hole supply layer patterns 125A and the gate electrodes 150A.

Herein, the hole-supply layer patterns 125A may serve to supply sufficient holes required for the erase operation of the memory cells to the memory cells, and may include a p-type semiconductor, for example, p+ polysilicon.

FIGS. 2A to 2D are cross-sectional views illustrating a non-volatile memory device in accordance with a second exemplary embodiment of the present invention and a fabrication method thereof. In the description of this embodiment, a detailed description for substantially the same elements as those in the above-described first exemplary embodiment will be omitted. First, the process shown in FIG. 1A is performed in the same manner as the first exemplary embodiment, and then the processes shown in FIGS. 2A to 2D are performed.

Figure 2A:
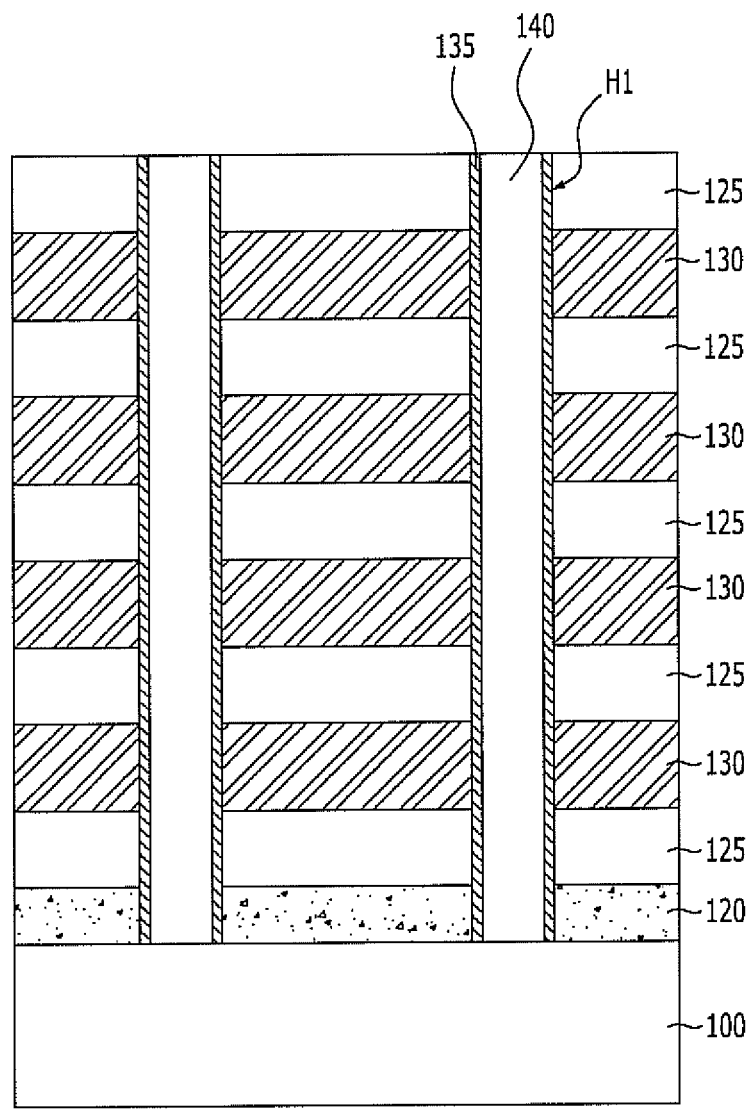
FIGS. 2A to 2D are cross-sectional views illustrating a non-volatile memory device in accordance with a second embodiment of the present invention and a fabrication method thereof.

Referring to FIG. 2A, a stack structure, which includes an alternating stack of a plurality of hole-supply layers 125 and a plurality of sacrificial layers 130, and an interlayer insulating film 120 are selectively etched to form channel holes H1 which expose the substrate 100. The channel holes H1 may have a circular or oval shape when viewed from the top, and a plurality of the channel holes H1 may be arranged in the form of a matrix.

Then, a protective film 135 is formed on the channel holes H1, after which a channel layer 140 is formed in the channel holes H1. The channel layer 140 may be formed using a semiconductor material, for example, polysilicon.

Herein, the protective film 135 may prevent the channel layer 140 from being etched in a subsequent process in which the sacrificial layers 130 are removed. Also, the protective film 135 may be formed using an oxide- or nitride-based material. Particularly, the thickness of the protective film 135 may be controlled to make hole tunneling possible or to completely insulate the hole-supply layers 125 and the channel layer 140.

Figure 2B:
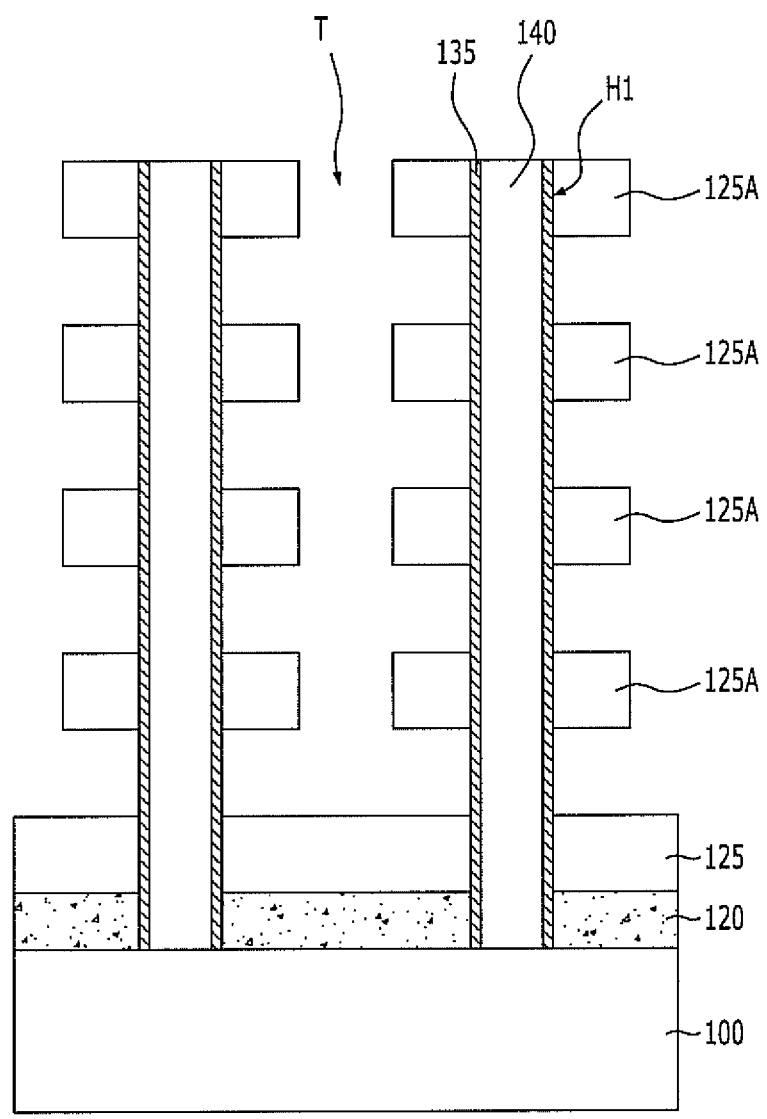

Referring to FIG. 2B, the hole-supply layers 125 (excluding the hole supply layer 125 located at the lowest portion of the stack structure) and the sacrificial layers 130 in FIG. 2A are selectively etched to form a slit hole T through the hole-supply layers 125 and sacrificial layers 130 at both sides of the channel holes H1. A plurality of the slit holes T may be arranged in parallel to each other in the form of slits which extend in a direction crossing the cross-section shown in FIG. 2B. The remaining hole-supply layers 125 will hereinafter be referred to as the hole-supply layer patterns 125A.

Then, the sacrificial layers 130 exposed through the slit hole T are removed. To remove the sacrificial layers 130, a wet etching process may be performed using an etch selectivity with respect to the hole supply layer patterns 125A.

Figure 2C:
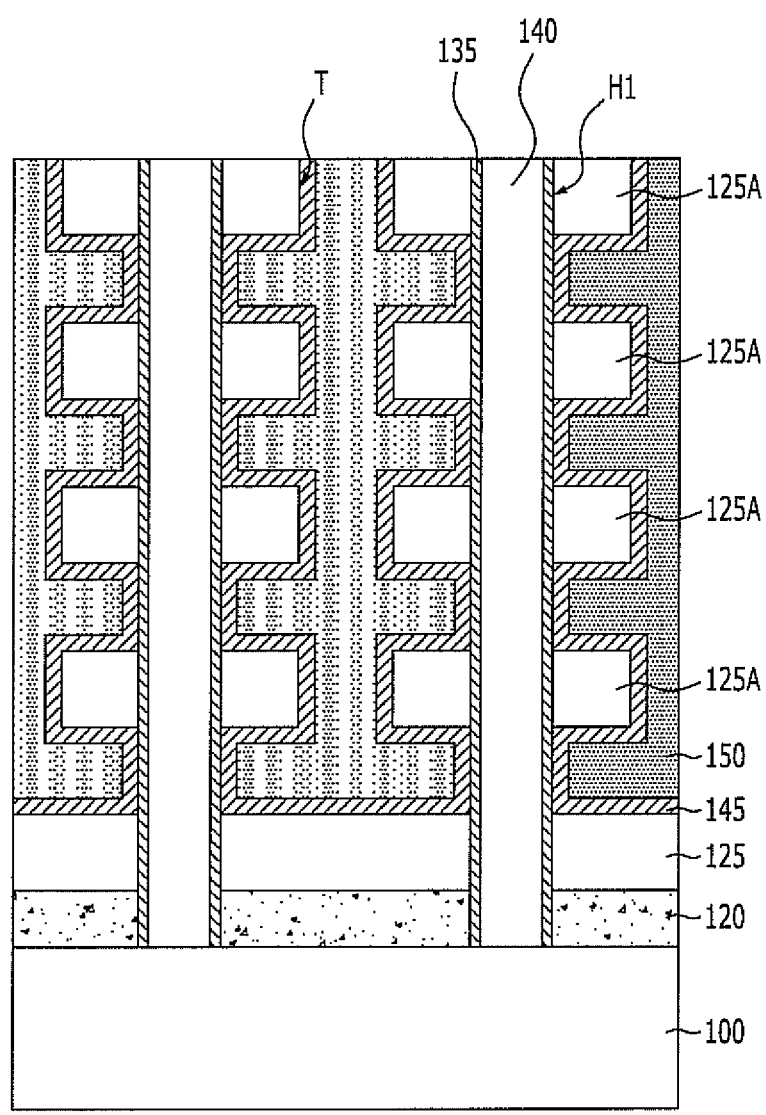

Referring to FIG. 2C, a memory film 145 is formed along the inner wall of the space formed by removing the sacrificial layers 130 through the slit hole T. The memory film 145 may be formed by sequentially depositing a tunnel insulating film, a charge trapping film and a charge blocking film and may have a three-layer structure of ONO (Oxide-Nitride-Oxide). Meanwhile, the protective film 135 may serve as the tunnel insulating film, and in this case, the process of depositing the tunnel insulating film may be omitted.

Then, a conductive film 150 for gate electrodes is formed on the memory film 145 so as to fill the space formed by removing the sacrificial layers 130. The conductive film 150 for gate electrodes may include a conductive material, for example, a metal or a metal nitride, which can be conformally deposited by chemical vapor deposition (CVD) or atomic layer deposition (ALD).

Figure 2D:
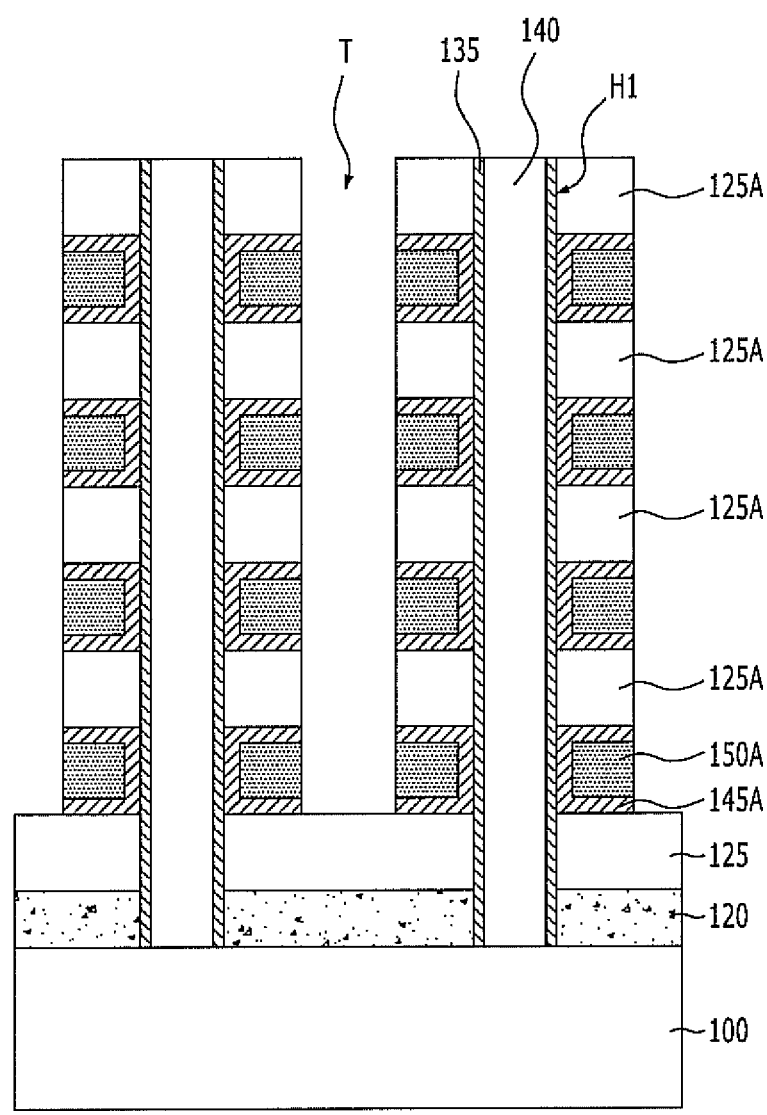

Referring to FIG. 2D, the memory film 145 and the conductive film 150 for gate electrodes, which are present in the slit hole T, are etched such that the memory film 145 and the conductive film 150 for gate electrodes are separated with respect to the slit hole T. As a result, gate electrodes 150A are formed between the hole-supply layer patterns 125A. The remaining memory film 145 is referred to as the memory film patterns 145A.

The above-described second embodiment differs from the first embodiment in that the protective film 135 surrounding the side of the channel layer 140 is formed.

FIGS. 3A to 3G are cross-sectional views illustrating a non-volatile memory device in accordance with a third exemplary embodiment of the present invention and a fabrication method thereof. In the description of this embodiment, a detailed description for substantially the same elements as those in the above-described first or second embodiment will be omitted.

Figure 3A:
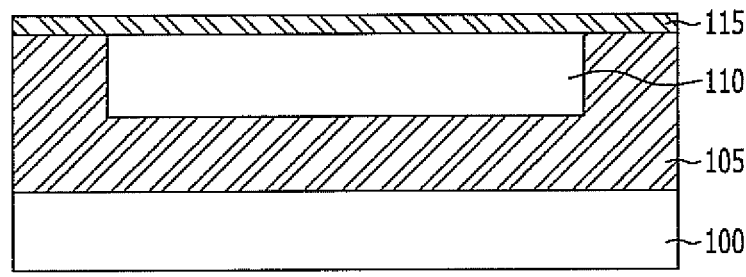

Referring to FIG. 3A, a first pass gate electrode layer 105 is formed on a substrate 100. The substrate 100 may be a semiconductor substrate such as a single-crystal silicon substrate, and the first pass gate electrode layer 105 may be formed using a conductive material, for example, a doped polysilicon or a metal.

Then, the first pass gate electrode layer 105 is selectively etched to form grooves, after a sacrificial film pattern 110 is formed in each of the grooves.

Herein, the sacrificial film patterns 110 are removed in a subsequent process to provide a space where a sub-channel hole as described below is to be formed. The sacrificial film patterns 110 may be formed using a material which has an etch selectivity with respect to a second pass gate electrode layer as described below, an interlayer insulating film, the stack structure and the first pass gate electrode 105. Also, the sacrificial film patterns 110 may be arranged in the form of a matrix when viewed from the top and may have an island having a long axis extending in the direction of the cross-section shown in FIG. 3A and a short axis extending in a direction crossing the cross-section.

Then, a second pass gate electrode layer 115 is formed on the first pass gate electrode layer 105 and the sacrificial film patterns 110. The second pass gate electrode layer 115 may be formed using a conductive material, for example, a doped polysilicon or a metal. Meanwhile, the first and second pass gate electrodes 105 and 115 may serve as gate electrodes for pass transistors and may have a shape surrounding the sacrificial film patterns 110.

Figure 3B:
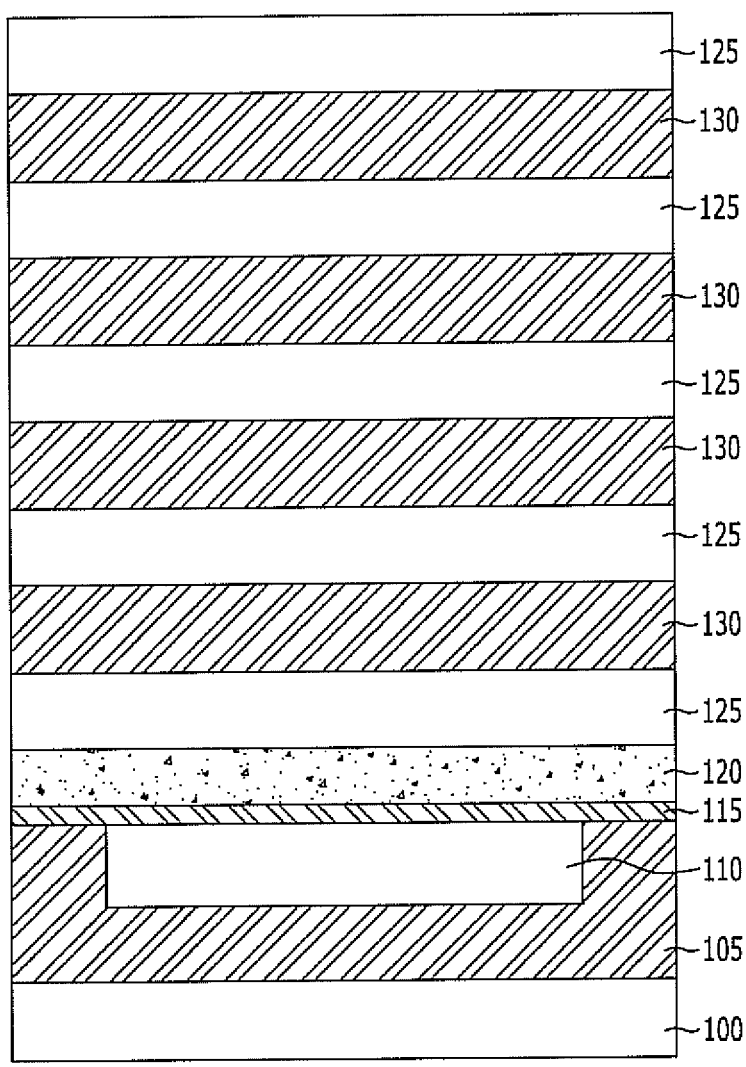

Referring to FIG. 3B, an interlayer insulating film 120 is formed on the second pass gate electrode layer 115, and then a plurality of hole-supply layers 125 and a plurality of sacrificial layers 130 are alternately formed on the interlayer insulating film 120. The interlayer insulating film 120 may be formed using an oxide- or nitride-based material.

Herein, the hole-supply layers 125 serve to supply sufficient holes to memory cells during the erase operation of the memory cells and may be formed using a p-type semiconductor, for example, p+ polysilicon. In addition, the sacrificial layers 130 are removed in a subsequent process to provide spaces where gate electrodes are to be formed. The sacrificial layers 130 may be formed using a material having an etch selectivity with respect to the hole-supply layers 125, for example, an oxide-based material.

Figure 3C:
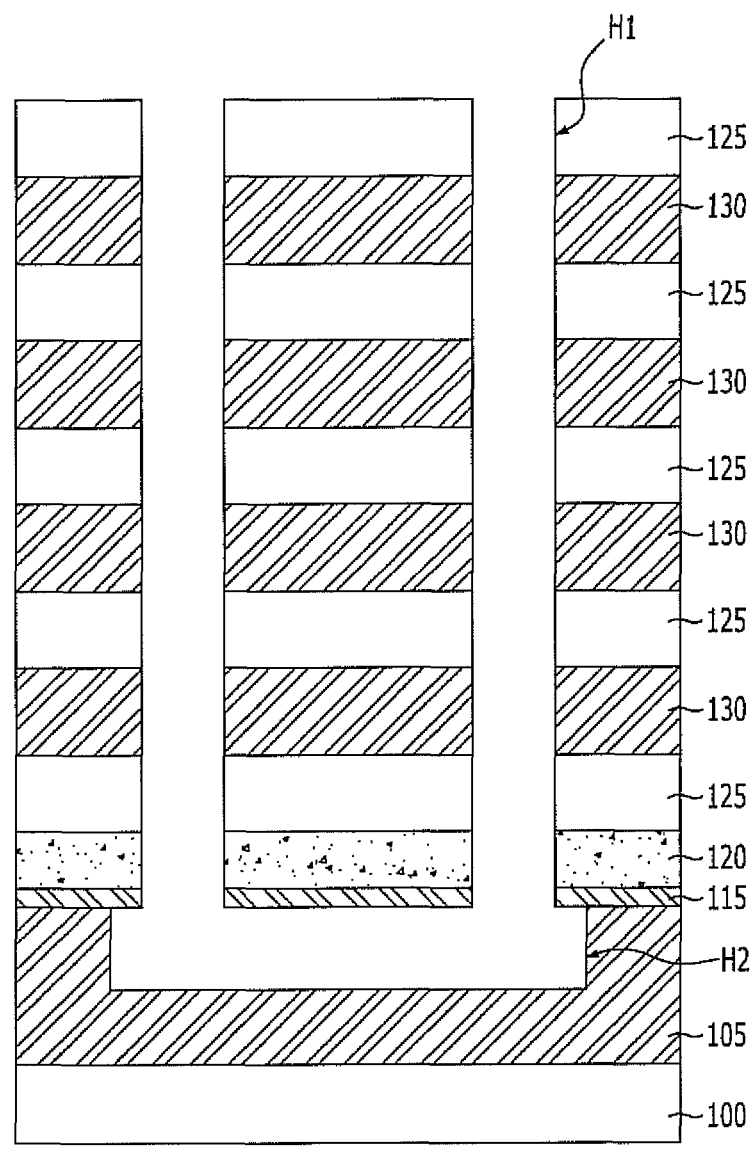

Referring to FIG. 3C, the stack structure, the interlayer insulating film 120 and the second pass gate electrode layer 115 are selectively etched to form a pair of channel holes H1 which expose each of the sacrificial film patterns 110. Each pair of the channel holes H1 provides spaces for forming channel layers and may be disposed for each of the sacrificial film patterns 110.

Then, the sacrificial film patterns 110 exposed through the channel holes H1 are removed. To remove the sacrificial film patterns 110, a wet etching process may be performed using an etch selectivity with respect to the first and second pass gate electrode layers 105 and 115, the interlayer insulating layer 120 and the stack structure. As a result, a sub-channel hole H2 connecting each pair of the channel holes H1 is formed in the space formed by removing each of the sacrificial film patterns 110.

Figure 3D:
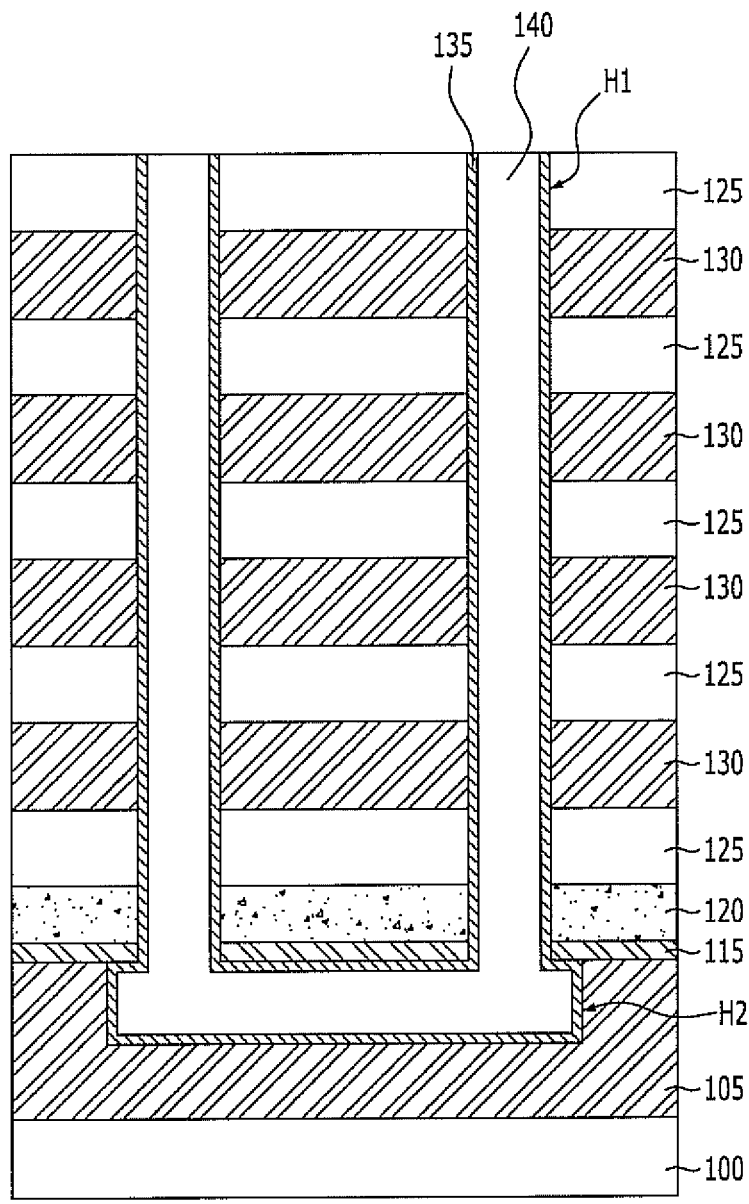

Referring to FIG. 3D, a protective film 135 is formed along the inner wall of each pair of the channel holes H1 and each of the sub-channel holes H2. Herein, the protective 135 formed on the inner wall of the channel holes H1 may serve to prevent channel layers 140 as described below from being etched in a subsequent process in which the sacrificial layers 130 are removed. The protective film 135 formed on the inner wall of the sub-channel holes H2 may serve as a gate insulating film for pass transistors.

Then, channel layers 140 are formed in each pair of the channel holes H1 and each of the sub-channel holes H2. The channel layers 140 can be divided into main channel layers, which serve as the channels of memory cells or selection transistors, and sub-channel layers which serve as the channels of pass transistors. The channel layers 140 may be formed using, for example, a semiconductor material such as polysilicon.

Referring to FIG. 3E, the hole-supply layers 125 (excluding the hole supply layer 125 located at the lowest portion of the stack structure) and the sacrificial layer 130 are selectively etched to form a slit hole T through the hole-supply layers 125 and sacrificial layers 130 at both sides of the channel holes H1. A plurality of the slit holes T may be arranged in parallel to each other in the form of slits which extend in a direction crossing the cross-section shown in FIG. 3E, and the remaining hole-supply layers 125 will hereinafter referred to as the hole-supply layer patterns 125A.

Then, the sacrificial layers 130 exposed through the slit hole T are removed. To remove the sacrificial layers 130, a wet etching process may be performed using an etch selectivity with respect to the hole supply layer patterns 125A.

Figure 3F:
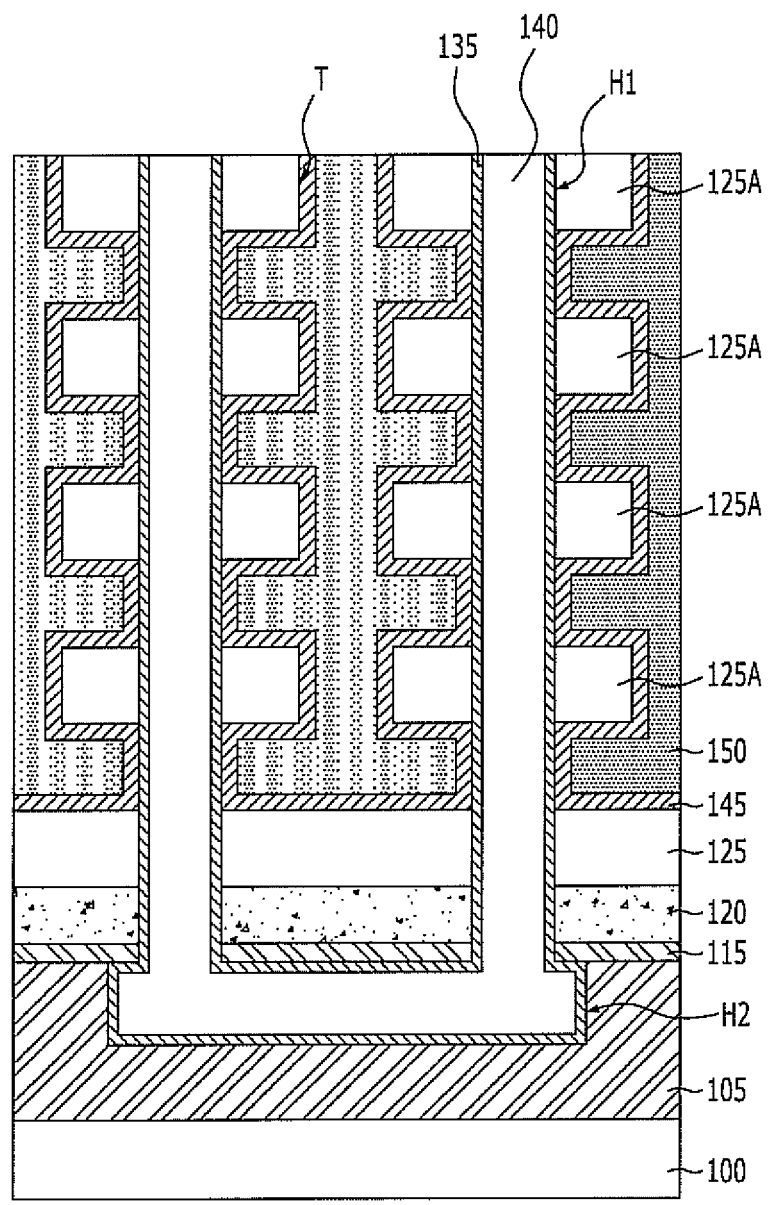

Referring to FIG. 3F, a memory film 145 is formed along the inner wall of the space formed by removing the sacrificial layers 130 through the slit hole T. The memory film 145 may be formed by sequentially depositing a tunnel insulating film, a charge trapping film and a charge blocking film and may have a three-layer structure of ONO (Oxide-Nitride-Oxide). Meanwhile, the protective film 135 may serve as the tunnel insulating film, and in this case, the process of depositing the tunnel insulating film may be omitted.

Then, a conductive film 150 for gate electrodes is formed on the memory film 145 so as to fill the space formed by removing the sacrificial layers 130. The conductive film 150 for gate electrodes may include a conductive material, for example, a metal or a metal nitride, which can be conformally deposited by chemical vapor deposition (CVD) or atomic layer deposition (ALD).

Figure 3G:
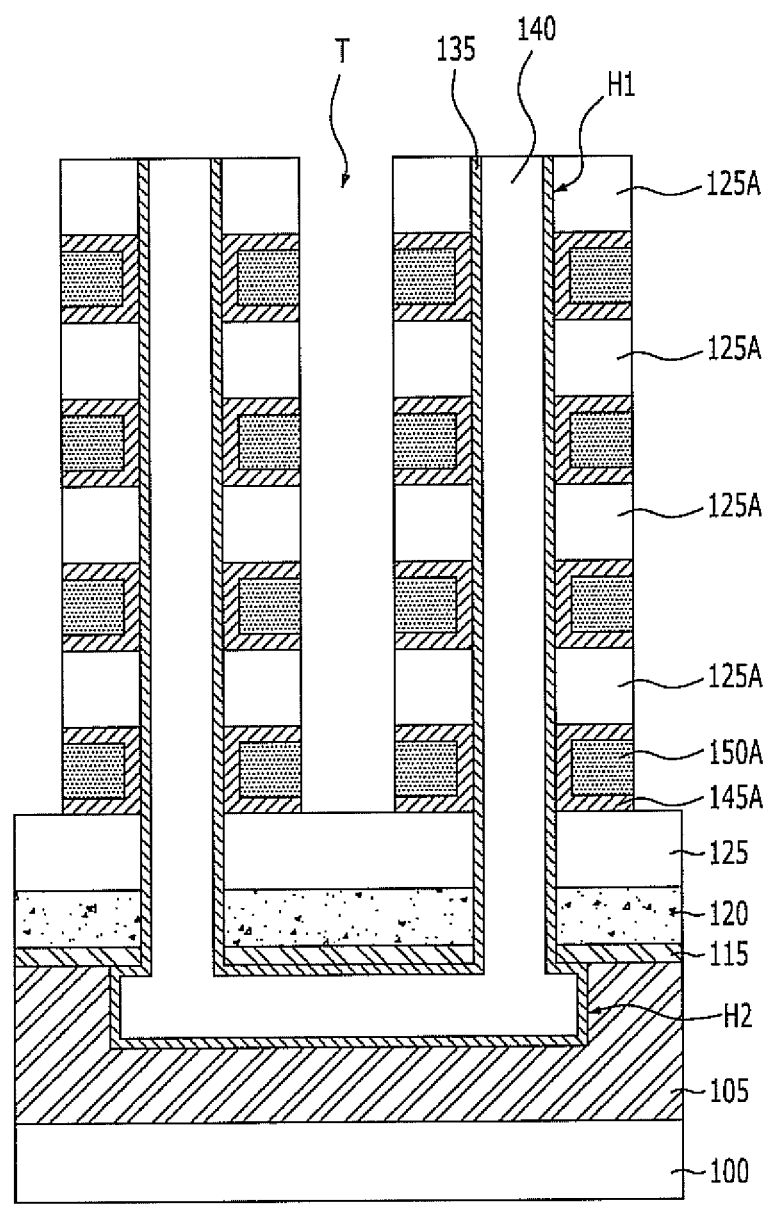

Referring to FIG. 3G, the memory film 145 and the conductive film 150 for gate electrodes, which are present in the slit hole T, are selectively etched such that the memory film 145 and the conductive film 150 for gate electrodes are separated with respect to the slit hole T. As a result, gate electrodes 150A are formed between the hole-supply layer patterns 125A or between hole-supply layer 125 for the lowest portion of the stack structure and the hole-supply layer pattern 125A. The remaining memory film 145 is referred to as the memory film patterns 145A.

The above-described third exemplary embodiment differs from the first and second exemplary embodiments in that the pass gate electrode including the first and second pass gate electrodes 105 and 115 is formed under the interlayer insulating film 120 and this pass gate electrode has the sub-channel layer connecting each pair of the main channel layers.

In the non-volatile memory devices according to the above-described embodiments of the present invention and the fabrication methods thereof, the hole-supply layers are formed between the memory cells such that sufficient holes can be supplied to the memory cells during the erase operation of the memory cells. Accordingly, the erase operation of the memory cells can be smoothly performed without having to use the GIDL (Gate-Induced Drain Leakage) current, and the properties of the device can be prevented from being deteriorated due to program/erase cycling.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device comprising:
    channel layers extending perpendicular from a substrate;
    a plurality of hole-supply layers, each including a doped semiconductor material stacked along a length of the channel layers;
    a plurality of gate electrodes alternately stacked between the plurality of hole supply layers along the length of the channel layers; and
    a memory layer interposed between the channel layers and the plurality of gate electrodes, and between the plurality of hole-supply layers and the plurality of gate electrodes.

2. The non-volatile memory device of claim 1, wherein the doped semiconductor material includes a p-type semiconductor material.

3. The non-volatile memory device of claim 1, further comprising:
    a protective layer surrounding the channel layers.

4. The non-volatile memory device of claim 1, further comprising:
    a sub-channel layer connecting a corresponding pair of the channel layers.

5. The non-volatile memory device of claim 4, further comprising:
    a first pass gate electrode formed around and in contact with the sub-channel layer, and
    a gate insulating layer formed between the sub-channel layer and the first pass gate electrode.

6. The non-volatile memory device of claim 5, further comprising:
    a second pass gate electrode formed over the sub-channel layer.

7. A non-volatile memory device comprising:
    channel layers extending perpendicular from a substrate;
    a protective layer formed around the channel layers;
    a plurality of hole-supply layers, each including a doped semiconductor material stacked along a length of the channel layers;
    a plurality of gate electrodes alternately stacked between the plurality of hole supply layers along the length of the channel layers; and
    a memory layer formed between the channel layers and the plurality of gate electrodes, and between the plurality of hole-supply layers and the plurality of gate electrodes, wherein the memory layer includes the protective layer.

8. The non-volatile memory device of claim 7, wherein the doped semiconductor material includes a p-type semiconductor material.

9. The non-volatile memory device of claim 7, wherein the protective layer includes an oxide layer.

10. The non-volatile memory device of claim 7, further comprising:
    a sub-channel layer connecting a corresponding pair of the channel layers.

11. The non-volatile memory device of claim 10, further comprising:
    a first pass gate electrode formed around and in coming into contact with the sub-channel layer; and
    a gate insulating layer formed between the sub-channel layer and the first pass gate electrode.

12. The non-volatile memory device of claim 11, further comprising:
    a second pass gate electrode formed over the sub-channel layer.

* * * * *